US 8,539,400 B2

(12) United States Patent
Alpert et al.

(10) Patent No.: US 8,539,400 B2
(45) Date of Patent: Sep. 17, 2013

(54) ROUTABILITY USING MULTIPLEXER STRUCTURES

(75) Inventors: Charles J. Alpert, Austin, TX (US); Victor N. Kravets, White Plains, NY (US); Zhuo Li, Cedar Park, TX (US); Louise H. Trevillyan, Katonah, NY (US); Ying Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 13/248,119

(22) Filed: Sep. 29, 2011

(65) Prior Publication Data

US 2013/0086537 A1  Apr. 4, 2013

(51) Int. Cl.
*G06F 17/50* (2006.01)
(52) U.S. Cl.
USPC .......................................................... 716/104
(58) Field of Classification Search
USPC .................................................. 716/103, 104
See application file for complete search history.

(56) References Cited

U.S. PATENT DOCUMENTS

| | | | |
|---|---|---|---|
| 6,586,965 B2 | 7/2003 | Kuekes | |
| 6,587,990 B1 | 7/2003 | Andreev et al. | |
| 7,020,855 B2 | 3/2006 | Wallace | |
| 7,360,198 B2 | 4/2008 | Rana et al. | |
| 2005/0268267 A1* | 12/2005 | Shang | 716/9 |
| 2010/0042966 A1* | 2/2010 | Fry | 716/18 |
| 2010/0083195 A1* | 4/2010 | Fry et al. | 716/2 |

OTHER PUBLICATIONS

Li et al., "Low Power Multiplexer Tree Design Using Dynamic Propagation Path Control", IEEE Asia Pacific Conference on Circuits and Systems, Dec. 2008, pp. 838-841.*
Bryant, Randal E., "Graph-Based Algorithms for Boolean Function Manipulation", IEEE Transactions on Computers, C-35-8, Aug. 1986, pp. 677-691.
Kravets, Victor N. et al., "Resynthesis of Multi-level Circuits Under Tight Constraints Using Symbolic Optimization", ICCAD, 2002, pp. 687-693.

* cited by examiner

*Primary Examiner* — Vuthe Siek
*Assistant Examiner* — Aric Lin
(74) *Attorney, Agent, or Firm* — Stephen J. Walder, Jr.; Eustus D. Nelson

(57) ABSTRACT

Mechanisms are provided for generating a logic design of an integrated circuit device. An initial logic design representation of the integrated circuit device is received and one or more areas of the initial logic design representation are identified where logic elements in the one or more areas can be replaced with one or more multiplexer tree structures. Logic elements in the one or more areas of the initial logic design representation are replaced with multiplexer tree structures to generate a modified logic design representation. The modified logic design representation is output to a physical synthesis system to generate a physical layout of the integrated circuit device based on the modified logic design representation.

16 Claims, 8 Drawing Sheets

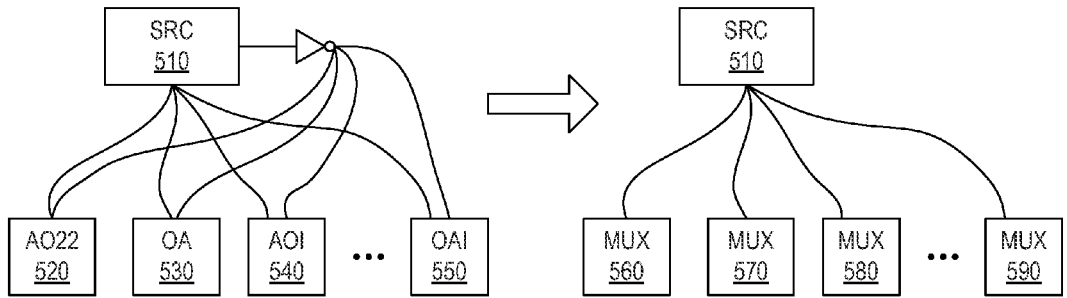

FIG. 5

FOR EACH SINK GATE $S_i$, GENERATE ONE STATE VECTOR WITH A 1 IN AN ITH LOGIC STATE BIT, WHERE I IS THE ROW OF THE STATE TABLE T AND A 0 IN ALL OTHER LOGIC STATE BITS OF THE STATE VECTOR

PROPAGATE THE STATE VECTOR FORWARD
  - GENERATE A COPY OF THE STATE VECTOR FOR EACH FAN-OUT NET
  - MERGE THE STATE VECTORS AT EACH CIRCUIT ELEMENT (GATE) WITH AN "OR" OPERATION FROM ALL FAN-INS TO GENERATE A NEW STATE VECTOR FOR THE CIRCUIT ELEMENT

MARK CIRCUIT ELEMENT AS ROOT OF A MULTIPLEXER TREE IN RESPONSE TO THE STATE VECTOR OF THE CIRCUIT ELEMENT COMPRISING ALL 1S.

FIG. 7

SELECT NEXT AND, NAND, NOR, OR GATE (DENOTE AS GATE A)

FIND ALL INPUT NETS OF GATE A (TRACE THROUGH BUFFERS/INVERTERS), K = $K_1$, $K_2,...,K_N$

FIND ALL SINKS OF NET GROUP K, S = $S_1, S_2,...,S_M$. NOTE THAT GATE A IS A SINK.

GENERATE AN M BY N STATE TABLE T, WHERE EACH ROW FOR A SINK $S_I$ AND EACH COLUMN FOR A NET $K_J$

FOR EACH GATE $S_I$:
    - IF GATE $S_I$ IS AN AND/NAND GATE:
        T[I, J] = 1 IF $K_J$ IS INPUT
        T[I, J] = 0 IF !$K_J$ IS INPUT
        T[I, J] = X IF $K_J$ IS NOT CONNECTED TO $S_I$

- IF GATE $S_I$ IS AN OR/NOR GATE:
        T[I, J] = 0 IF $K_J$ IS INPUT
        T[I, J] = 1 IF !$K_J$ IS INPUT
        T[I, J] = X IF $K_J$ IS NOT CONNECTED TO $S_I$

FIND THE LOGIC COMBINATION TO MAKE OUTPUT OF AND/NAND GATE OUTPUT A 1 AND OUTPUT OF OR/NOR GATE A 0.

IF T CONTAINS ALL $2^N$ LOGIC STATES, THEN THE SELECTED GATE IS A POTENTIAL N TO $2^N$ DECODER AND THE NET GROUP K COMPRISES CONTROL LINES.

*FIG. 6*

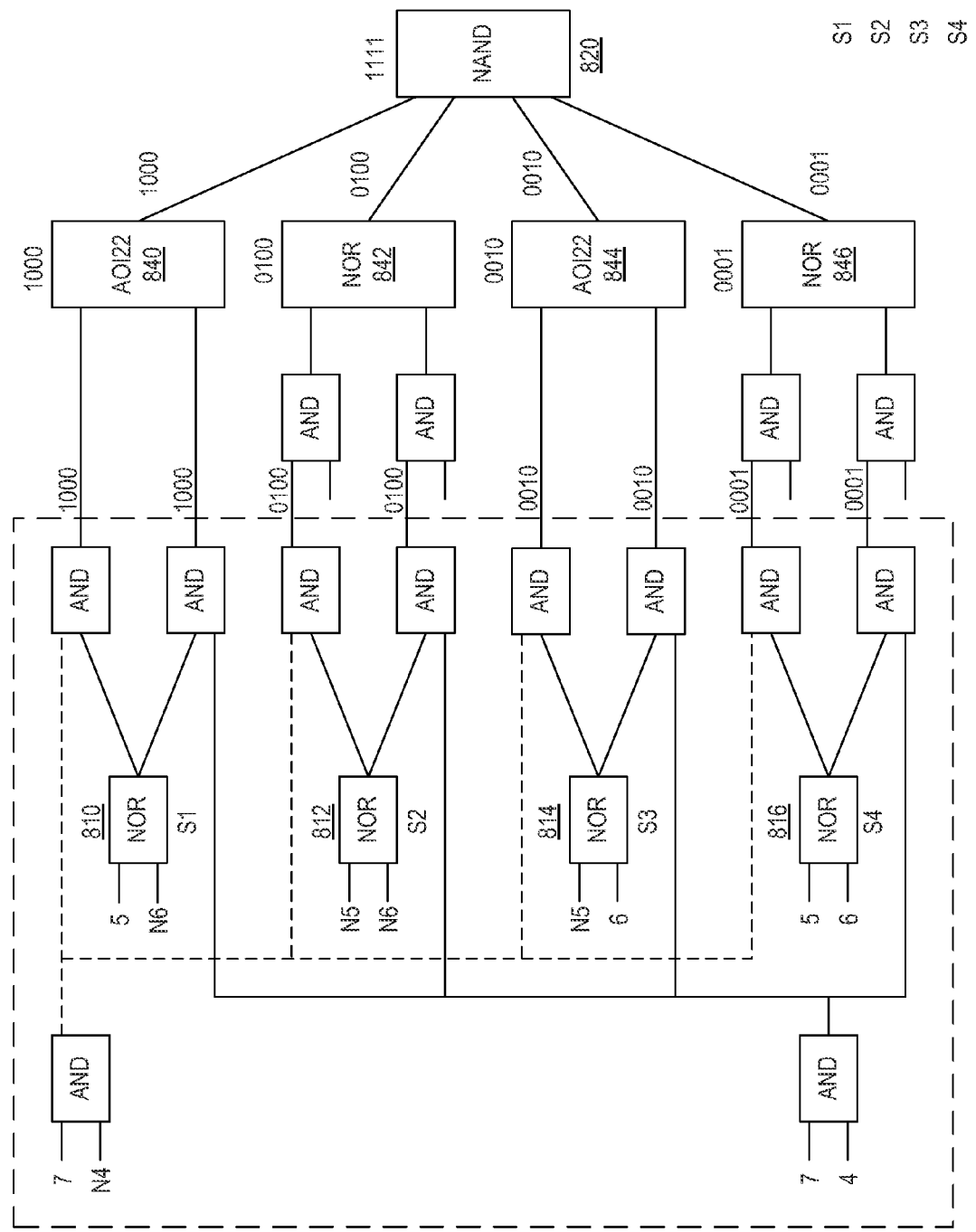

ROUTABILITY USING MULTIPLEXER STRUCTURES

BACKGROUND

The present application relates generally to an improved data processing apparatus and method and more specifically to mechanisms for improving design routability by finding portions of an integrated circuit design where multiplexer structures may be introduced to improve routability.

One aspect of modern electronic design automation is the performance of logic synthesis operations. Logic synthesis is the process by which an abstract definition of a desired circuit behavior, which may be provided as a register transfer level (RTL) specification or the like, is converted into a design implementation in terms of logic gates, wirings, and other circuit design elements. Many examples of mechanisms for performing logic synthesis operations are available including hardware description language (HDL) based mechanisms, very high speed integrated circuit (VHSIC) hardware description language (VHDL) based mechanisms, Verilog based mechanisms, and the like. The mechanisms can be used to generate various types of integrated circuit designs including general purpose integrated circuits, applications specific integrated circuits (ASICs), and the like.

An application specific integrated circuit (ASIC) is an integrated circuit device that is designed to perform a particular specialized function rather than being of general purpose, such as a general purpose central processing unit or the like. For example, many communication devices today utilize ASICs that are designed to perform specific communication operations. The design of such ASICs usually involves a large number of signal communication paths on the chip as well as many crossbar logic structures. A crossbar logic structure, or crossbar latch, is a circuit element that is comprised of a signal line crossed by two control lines which, depending on the voltages sent down the various lines, can simulate the action of an AND gate, OR gate, and/or NOR gate (see U.S. Pat. No. 6,586,965 for more information on crossbar latches). The logic synthesis of such crossbar logic structures and the like often introduces complexities into the integrated circuit design that makes it difficult to perform placement and wiring operations, i.e. physical synthesis.

SUMMARY

In one illustrative embodiment, a method, in a data processing system comprising at least one hardware-implemented processor and at least one memory, for generating a logic design of an integrated circuit device. The method comprises receiving, in the data processing system, an initial logic design representation of the integrated circuit device. The method further comprises identifying, by the data processing system, one or more areas of the initial logic design representation where logic elements in the one or more areas can be replaced with one or more multiplexer tree structures. Moreover, the method comprises replacing, by the data processing system, logic elements in the one or more areas of the initial logic design representation with multiplexer tree structures to generate a modified logic design representation. In addition, the method comprises outputting, by the data processing system, the modified logic design representation to a physical synthesis system to generate a physical layout of the integrated circuit device based on the modified logic design representation.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 5 is an example diagram illustrating the wirelength and pin improvement achieved through application of the illustrative embodiments;

FIG. 6 is an example diagram illustrating an algorithm for performing the control line identification in accordance with one illustrative embodiment;

FIG. 7 is an example diagram illustrating an algorithm for identifying a multiplexer tree root in accordance with one illustrative embodiment;

FIG. 8 is an example diagram of a circuit illustrating a correspondingly generated state table data structure T and state vectors V in accordance with one illustrative embodiment;

DETAILED DESCRIPTION

Figure 1:
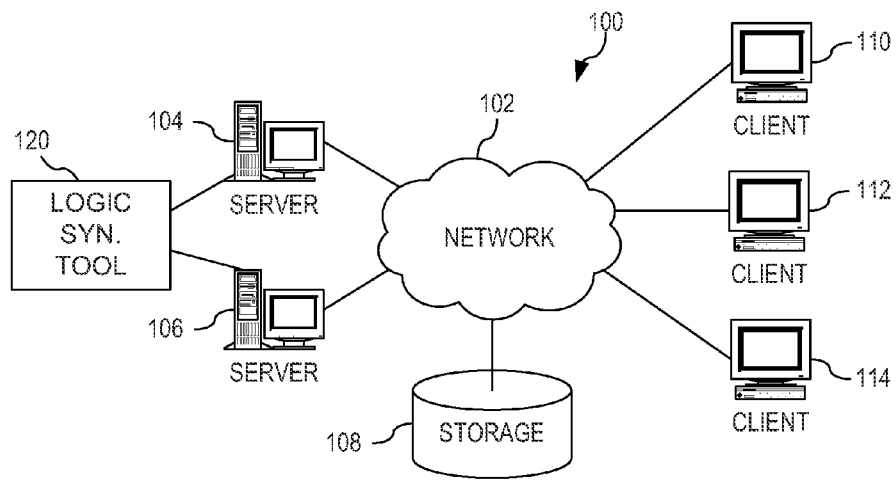
FIG. 1 is an example diagram of a distributed data processing system environment in which aspects of the illustrative embodiments may be implemented.

The illustrative embodiments provide a mechanism for improving design routability by providing a mechanism for finding portions of an integrated circuit design where multiplexer (mux) structures may be utilized to reduce routing complexity. As noted above, many different structures in an integrated circuit design, such as crossbar circuit element structures, logic XOR/XNOR trees, adders, or other logic elements, and the like can introduce complexities into the design which cause placement and wire routing to be difficult to perform. For such structures, logic synthesis tools generate complicated logic netlists through different technology mapping algorithms resulting in large numbers of compound logic gates, e.g., AND-OR (AO), OR-AND (OA), AND-OR-INVERT (AOI), OR-AND-INVERT (AOI), and other decoding structures instead of direct multiplexers. This is especially true when, in an ASIC design flow, logic synthesis is done by one organization and physical synthesis, i.e. placing and routing, is done by another organization.

When crossbar logic, XOR/XNOR tree logic, adder logic, decoder logic, or the like, for example, is synthesized with AOI gates, while this may provide some benefits from a area conservation viewpoint, it generally complicates the wire routing since placement algorithms cannot find logic structures and when multiplexer tree functionality in a design is synthesized using compound logic gates, NAND gates, and/or NOR gates it is extremely difficult for optimization mechanisms to find an optimum solution for the design. In addition, crossbar logic, XOR/XNOR tree logic, adder logic, decoder logic, and the like often creates high fanout, inefficient buffer trees since extra inverters are generally needed with the AOI/OAI/NAND/NOR structures used to locally synthesize the crossbar logic elements. Moreover, the use of compound logic gates and multiple fan-in NAND gates creates higher pin densities in the logic implementation than multiplexer gates. This complicates detailed wire routing operations. Another side effect of using compound logic gates, NAND gates, and NOR gates is increased wirelength of buffer trees due to polarity issues. The result is that even the best physical synthesis tools may take an extremely long time to optimize crossbar or multiplexer tree structure circuits or may even fail to find a solution for the physical synthesis, i.e. physical placement and wire routing. To the contrary, in many cases, a time consuming and error prone manual process must be followed in order to finish the logic synthesis so that physical synthesis can be performed.

The illustrative embodiments provide a mechanism to transform a given logic netlist into a new logic netlist by way of a series of operations, where the new logic netlist is relatively less complex with regard to physical placement and wire routing. For example, the new logic netlist has less pins and a smaller number of required connections than otherwise would be required using standard logic synthesis mechanisms that introduce compound logic gates and NAND/NOR gates, thereby making the wire routing less complex during physical synthesis. For example, in one illustrative embodiment, the objective is to find where the logical function of more primitive logic gates performs a multiplexer (mux) operation (or mux tree operation) and replace the primitive gates with a multiplexer or multiplexer tree. The mechanisms of the illustrative embodiments may further identify potential control signals and multiplexer tree roots and uses a sophisticated methodology for re-implementing a partial cone defined by these elements.

The series of operations performed by the illustrative embodiments work in conjunction with standard logic synthesis mechanisms. For example, the illustrative embodiments may take the results of known logic synthesis mechanisms, perform the series of operations on the results generated by the logic synthesis mechanisms, and provide the new logic netlist generated by the mechanisms of the illustrative embodiments, which has a same logic function as the logic function generated by the logic synthesis mechanisms but a different logic netlist, to a physical synthesis mechanism to perform physical placement and wire routing. For example, the illustrative embodiments may transform existing compound logic gates, e.g., AND-OR (AO), OR-AND (OA), AND-OR-INVERT (AOI), and OR-AND-INVERT (OAI) gates, into 2-to-1 multiplexer structures (muxes). This simplifies the compound logic gates to multiplexers which are easier to perform physical synthesis on due to the relatively smaller number of pins and smaller number of wire paths required.

The illustrative embodiments may further find and mark control lines of n-to-2n decoders by scanning all OR/NOR/AND/NAND gates and generating a logic state table for all cousin gates (logic gates that are driven by the nets that also drive the selected OR/NOR/AND/NAND gates), and checking the completeness of logic state coverage. Furthermore, the multiplexer roots in the original logic netlist may be found through a state vector propagation algorithm and marked appropriately. This information may be provided to a logic decomposition tool which uses this information to decompose existing logic circuits into multiplexer trees. The result is an integrated circuit design that is comprised of multiplexer trees that facilitate a simplified physical placement and wire routing during physical synthesis.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
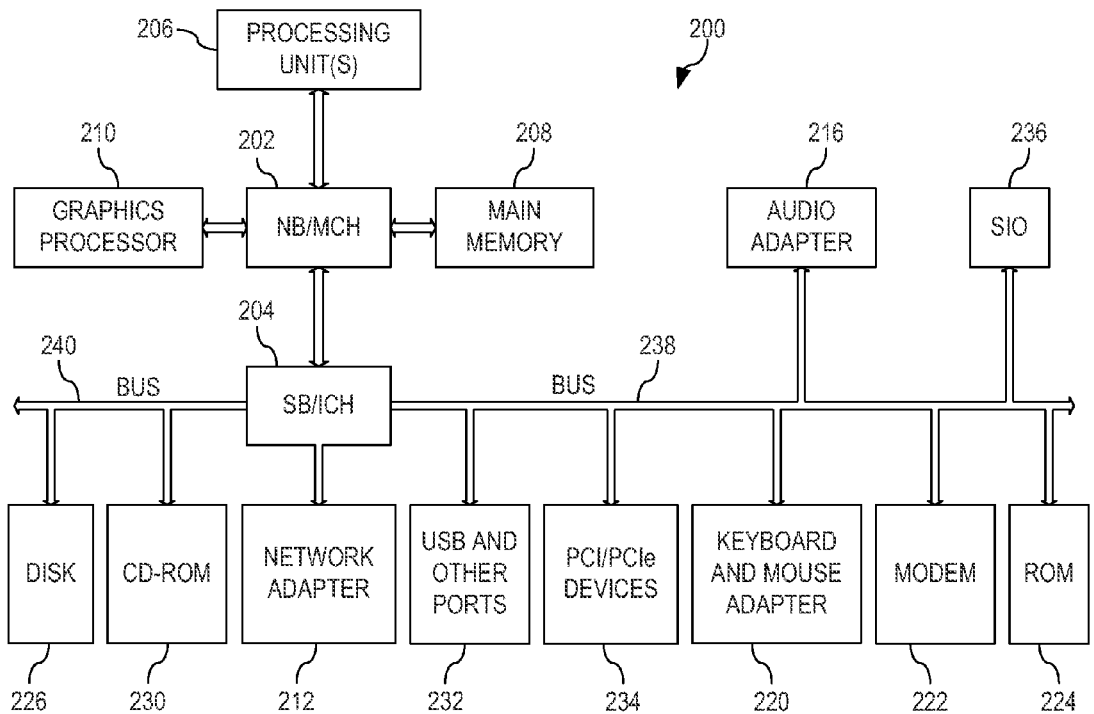
FIG. 2 is an example diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System p® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

With reference again to the distributed data processing system environment of FIG. 1, in accordance with the illustrative embodiments, one or more of the servers 104-106 in FIG. 1 may provide a logic synthesis tool 120 that is augmented to implement the features of the illustrative embodiments. The augmented logic synthesis tool 120 may be accessed by one or more users via their client computing devices 110-114 via one or more networks 102. The augmented logic synthesis tool 120 may operate on an original integrated circuit device specification provided by the client devices 110-114, stored in the network attached storage device 108, stored in association with one or more of the servers 104-106, or otherwise made accessible to the augmented logic synthesis tool 120 on the servers 104-106 either through a direct communication connection or network communication connection. As mentioned above, the servers 104-106 and/or client devices 110-114 may have a configuration similar to that shown in FIG. 2. Essentially, these computing devices have at least one processor and at least one memory, the memory being configured to store instructions and data for implementing aspects of the illustrative embodiments when executed or operated on by the at least one processor.

The augmented logic synthesis tool 120 of the illustrative embodiments comprises one or more algorithms executed by a computing device for performing a known logic synthesis operation and then applying the additional features of the illustrative embodiments to the resulting integrated circuit design as described hereafter, to thereby generate a placed and optimized netlist defining an optimized integrated circuit design. The application of the additional features of the illustrative embodiments operates to find areas of the integrated circuit design where the logic may be simplified for physical placement and wire routing purposes by replacing logic elements with multiplexer trees having a relatively smaller number of pins and less complex wire routing configurations. In particular, the illustrative embodiments search the integrated circuit design for crossbar circuits and portions of the integrated circuit design that may be represented as multiplexer trees so that they may be re-synthesized using the mechanisms of the illustrative embodiments.

The re-synthesizing performed by the illustrative embodiments involves two different algorithms which may be applied independently of each other or in combination with each other depending upon the implementation. In a first algorithm, the mechanisms of the illustrative embodiments replace all local compound logic gates, e.g., OA/AO/OAI/AOI gates, with 2-to-1 multiplexers and reduce inverters by checking if any inverting signal pairs, e.g., s and !s, are input to the AOI/OAI gates. Thereafter, in a second algorithm, logic bit forward techniques are used to mark potential control lines and multiplexer roots to identify decoders. Thereafter, the marked control lines and multiplexer roots are used as a basis for performing a re-synthesis of portions of the integrated circuit design corresponding to the marked control lines and multiplexer roots.

Figure 3:
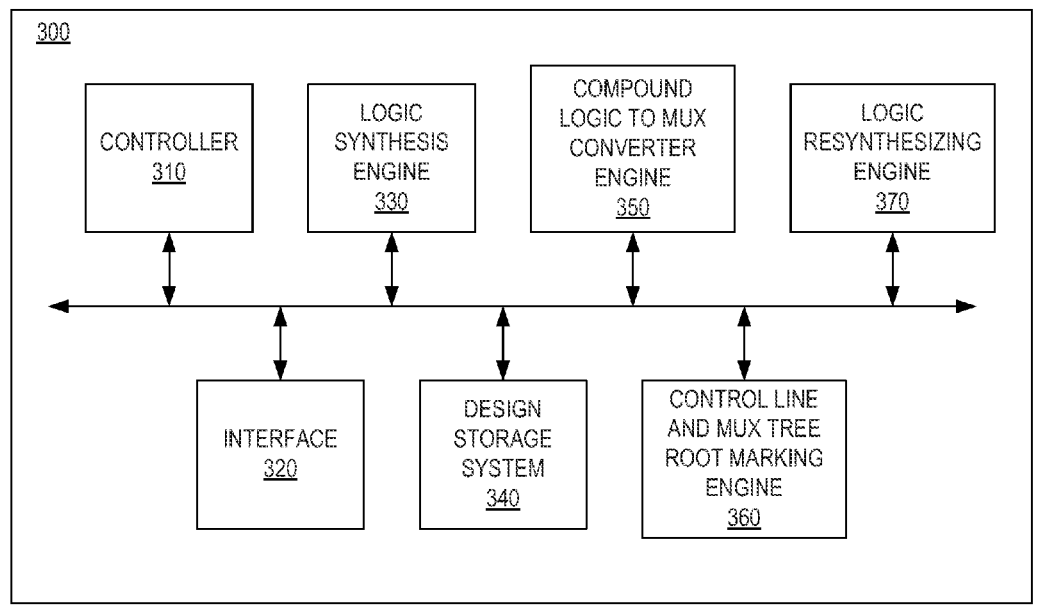
FIG. 3 is an example block diagram illustrating the primary operational elements of a logic synthesis tool in accordance with one illustrative embodiment.

FIG. 3 is an example block diagram illustrating the primary operational elements of a logic synthesis tool 300 in accordance with one illustrative embodiment. The elements shown in FIG. 3 may be implemented in hardware, software, or any combination of hardware and software. For example, in one illustrative embodiment, the depicted elements may be implemented as software instructions executing on one or more hardware-implemented processors, such as one or more processing units 206 in FIG. 2 utilizing one or more memories such as a memory 208 in FIG. 2 or the like. In one illustrative embodiment, the elements shown in FIG. 3 may be implemented on one or more server computing devices that are accessed by client computing devices via one or more data networks, for example.

As shown in FIG. 3, the logic synthesis tool 300 comprises a controller 310, an interface 320, a logic synthesis engine 330, a design storage system 340, an compound logic to multiplexer converter engine 350, a control line and multiplexer tree root marking engine, and a logic re-synthesizing engine 370. The controller 310 controls the overall operation of the logic synthesis tool 300 and orchestrates the operation of the other elements 320-370. The interface 320 provides a communication pathway through which user input may be received, integrated circuit design information may be received, and various outputs of the logic synthesis tool 300 may be output/transmitted for use by a user and/or other computing devices coupled to the logic synthesis tool 300.

The logic synthesis engine 330 may be any generally known or later developed logic synthesis engine 330 that operates on an original netlist data structure, such as may be provided as a register transfer level (RTL) specification, that represents an integrated circuit design and generates a design implementation in terms of logic gates, wirings, and other circuit design elements. The logic synthesis engine 330 may receive the original netlist data structure from the design storage system 340 which may store this original netlist data structure, or from another computing device or storage system via the interface 320, e.g., client computing devices 110-114, server 104/, 106, network attached storage 108 in FIG. 1, or the like. The result of the logic synthesis engine 330 is an initial logic design of the integrated circuit device that may be stored in the design storage system 340 and/or provided to the compound logic to multiplexer converter engine 350 and/or the control line and multiplexer root tree marking engine 360.

The compound logic to multiplexer (mux) converter engine 350 analyzes the initial logic design of the integrated circuit device generated by the logic synthesis engine 330 to identify compound logic, e.g., AO, OA, AOI, and OAI gates, in the initial logic design, e.g., the initial logic design is traversed and definition boxes or other elements defining the logic elements of the initial logic design are checked to see if they have a label specifying them to be a compound logic gate, for example an AO, OA, AOI, or OAI gate. The identified compound logic gates are replaced in the initial logic design with multiplexers, e.g., 2-to-1 multiplexer or any other suitable multiplexer. The resulting integrated circuit device has a smaller wirelength and number of input/output pins.

Figure 4:
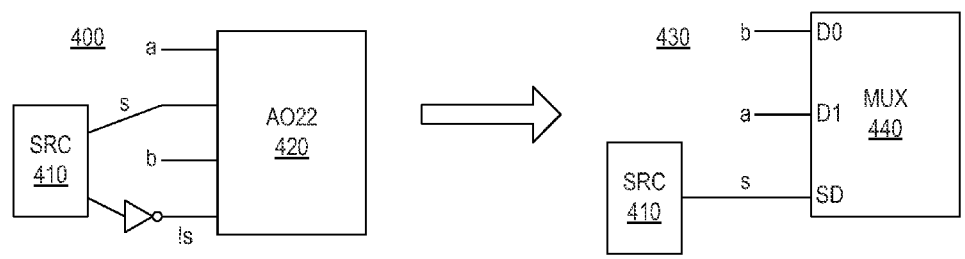
FIG. 4 illustrates an example of the replacement of compound logic gates performed by the compound logic to multiplexer converter engine in FIG. 3.

FIG. 4 illustrates an example of the replacement of compound logic gates performed by the compound logic to multiplexer converter engine 350 in FIG. 3. As shown in FIG. 4, an initial logic design 400 may comprise a source circuit element 410 providing both an output s and an inverted output !s to an AO22 gate 420. AO gates may have different "shapes" defined by the number of ports and inputs to the AO gate. The "AO22" gate 420 is an AO gate having 2 ports, each with 2 inputs; an "AO222" gate would have 3 ports, each having 2 inputs; and an "AO32" gate would have two ports, the first one having 3 inputs and the second having 2 inputs. An AO22 gate 420 is used here only as an example and the invention is not limited to such.

This AO22 gate 420 is identified in the initial logic design 400 by the compound logic to multiplexer converter engine 350 and replaced with a multiplexer 440 in a modified logic design 430. As can be seen from FIG. 4, the replacement causes the inverted input !s into the AO22 gate 420 to be eliminated. The multiplexer 440 provides a same functional result as the AO22 gate 420 but with less pins and less complex wiring. This is illustrated in FIG. 5.

As shown in FIG. 5, the initial logic design 400 results in 8 pins at the compound logic gates 520-550 and 8 wire routings from the output of the source 510 and the inverter. To the contrary, the modified logic design 430 generated by the compound logic to multiplexer converter engine 350 results in only 4 pins at the logic elements 560-590 since the inverter path to the compound logic elements is eliminated. That is, the only wirings are from the source circuit 510 to the multiplexers 560-590. As a result, the wirelength and number of pins are reduced (and thus improved) by application of the compound logic gate conversion mechanisms of the illustrative embodiments.

It should be noted that FIGS. 4 and 5 are simplified illustrations and actual integrated circuit designs will encompass hundreds or thousands of such logic elements, in which case the wirelength and pin improvements achieved by implementation of the compound logic to multiplexer converter engine 350 are even more pronounced.

In addition, the illustrative embodiments provide further mechanisms for improving the initial logic design for purposes of physical synthesis by re-synthesizing portions of the initial logic design corresponding to control lines and multiplexer tree roots (here the "multiplexer tree" is referring to the logical function performed which may be implemented as more primitive logic gates that implement a multiplexer function). With reference again to FIG. 3, the control line and multiplexer tree root marking engine 360 may operate on the modified logic design result generated from the compound logic to multiplexer converter engine 350 or may operate on the initial logic design to identify and mark control lines and multiplexer tree roots.

With regard to identifying control lines in the logic design (either the initial logic design or the modified logic design), the control line and multiplexer tree root marking engine 360 starts with a selected logic gate in the logic design, analyzes the nets of the selected gate to generate a state table comprising rows for sinks of the nets. The building of the state table is performed for essentially determining a logic combination to make AND/NAND logic gates output a 1 logic state and OR/NOR gates output a 0 logic state. The state table is analyzed to determine if selected gate is a n-to-$2^n$ decoder, in which case the nets associated with the selected logic gate are control nets. For example, a determination may be made as to whether the state table implements all of the $2^n$ logic states of a n-to-$2^n$ decoder. For example, for a 2->4 decoder with inputs x and y, the output states would be !x!y, !xy, x!y and xy. For a 3->8 decoder, with inputs x, y, and z, there would be 8 output combinations: !x!y!z, !x!yz, !xy!z, !xyz, x!y!z, x!y!z!, xy!z and xyz. As a state table, a 2->4 decoder would be a function with 2 inputs and 4 outputs such as:

| Input s1 | Input s2 | Output o00 | output o01 | output o10 | output o11 |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

FIG. 6 is an example diagram illustrating an algorithm for performing the control line identification in accordance with one illustrative embodiment. The algorithm illustrated in FIG. 6 may be implemented by the control line and multiplexer tree root marking engine 360 and may be executed with regard to each AND, NAND, NOR, and OR gate in the initial logic design generated by the logic synthesis engine 330 or modified logic design output by the compound logic to multiplexer converter engine 350.

As shown in FIG. 6, the algorithm selects a next AND, NAND, NOR, or OR gate in the logic design. This gate is denoted as gate A. All input nets of gate A are found (tracing through buffers/inverters). These input nets are denoted $K_1$, $K_2, \ldots, K_n$ (where n is generally from 2 to 4 although other values and ranges of n may be used without departing from the spirit and scope of the illustrative embodiments) which together are referred to as the input net group K. All of the sinks S of the net group K are found by traversing and analyzing the netlist to identify the sinks S which are denoted $S_1$, $S_2, \ldots, S_m$ where m is approximately $2^n$. This includes the gate A which is a sink of this net group K as well.

A m by n state table data structure T is generated where each row of the state table data structure T corresponds to a sink $S_i$, where i is an integer from 1 to m, and each column of the state table data structure T corresponds to a net $K_j$ where j is an integer from 1 to n. For each sink $S_i$, it is determined whether the sink $S_i$ is an AND gate or NAND gate. If the sink $S_i$ is an AND gate or NAND gate, then the value in T[i, j] in the state table data structure T is set to 1 if the non-inverted $K_j$ is an input. If the input to the gate A is the inverted $K_j$, i.e. the $!K_j$, (as can be determined by analyzing the inputs to the gate A to see if one of the inputs is fed by an inverter with source Kj) then the value for T[i, j] is 0. If $K_j$ is not connected to $S_i$, i.e. sink $S_i$ is a sink of another input net in the input net group K, then the value for T[i, j] is indeterminate, i.e. set to x.

If the sink $S_i$ is not an AND gate or a NAND gate, then the sink $S_i$ is either an OR gate or NOR gate. In this case, if the non-inverted $K_j$ is an input to the gate A, then the value of T[i, j] is set to 0. If the inverted $K_j$ is an input to the gate A, then the value of T[i, j] is set to 1. If $K_j$ is not connected to Si, then the value of T[i, j] is set to an indeterminate value x.

Having generated the state table data structure T and populated its entries for each of the sinks and input nets of each gate of interest, the state table data structures T can be analyzed to identify logic state combinations that make the AND/NAND gates output a logic 1 and logic state combinations that make the OR/NOR gates output a logic 0. If the state table data structure T contains all $2^n$ logic states then the gate A is potentially a n-to-$2^n$ decoder and input net group K are control lines. For example, consider the following logic gate definition:
  o=t1*t2*t3
  t1=a*!s1*!s2
  t2=b*!s1*s2
  t3=c*s1*!s2

For this logic to be a 4-to-1 multiplexer, the logic would need to have inputs a, b, c, and d and control inputs s1 and s2:
  o=t1*t2*t3
  t1=a*!s1*!s2
  t2=b*!s1*s2
  t3=c*s1*!s2
  t4=d*s1*s2

Thus, the original logic does not contain all of the $2^n$ logic states and thus, the gate A is not potentially a n-to-$2^n$ decoder. If it had all of the $2^n$ logic states in the definition of the logic gate A, then it is potentially a decoder.

Having identified the input net group K as control lines in this manner, they may be marked as such in the integrated circuit design data structure(s) for later use by logic re-synthesizing engine 370. This operation is done for each combination of sinks Si and input nets Kj for each gate of interest, e.g., each AND, NAND, NOR, and OR gate, in the integrated circuit device design. Some filtering of sinks, nets, and/or gates may be performed such that not all sinks, nets, and gates in a design need to be analyzed in this manner. The filtering criteria is implementation dependent and thus, can take many different forms depending on the interests at the time. As one example, such filtering may be accomplished by operating only on nets/gates that are in a congested region defined by a global routing engine or a congestion analysis engine such that only those gates/nets are re-synthesized.

As another example, such filtering may be filtering based on the type of gate and the numbers of non-inverted sinks on each input net. That is, for a gate to be part of a 2-to-4 decoder, a gate would need to be an AND, NAND, OR, or NOR gate with at least two inputs and one output. The input nets have the restriction that each net or its inverse must have at least 4 non-inverted sinks. Thus, a first filtering criteria may be the type of gate, e.g., AND, NAND, OR, or NOR gate. A second filtering criteria may be to determine the number of non-inverted sinks of the input net. Then for each inverter sink, determine the number of their non-inverted sinks. The sum of the two counts, i.e. the number of non-inverted sinks of the input net and the number of non-inverted sinks of each inverter sink, must be equal to or greater than 4. This filter works for finding complete decoders because a 2-to-4 decoder must contain 4 combinations of the two inputs. Of course other filtering criteria may be used, depending on the particular implementation, without departing from the spirit and scope of the illustrative embodiments.

In addition to the identification of control lines in the manner described above and outlined in FIG. 6, the illustrative embodiments further identify multiplexer tree roots in the logic design of the integrated circuit device (either the initial logic design or modified logic design). FIG. 7 is an example diagram illustrating an algorithm for identifying a multiplexer tree root in accordance with one illustrative embodiment. The operation outlined in FIG. 7 may also be performed, for example, by the control line and multiplexer tree root marking engine 360.

As shown in FIG. 7, in order to identify the multiplexer tree root, for each sink $S_i$, a state vector V is generated. This operation is done for each combination of sinks Si and input nets Kj for each gate of interest, e.g., each AND, NAND, NOR, and OR gate, in the integrated circuit device design. Again, some filtering can be applied such that only sinks, nets, and gates of interest are submitted to this operation avoiding having to perform such operation on all of the sinks, nets, and gates of the integrated circuit device design, with the filtering criteria being implementation specific.

As mentioned above, for each sink Si, a state vector V is generated. The state vector V comprises $2^n$ bits for n control nets, where each bit represents one logic state of the control nets n. The state vector V for the sink Si is generated with a 1 for the logic state in the ith row of table T and 0 elsewhere. This state vector V is propated forward along the nets of the sink Si by generating a copy of the state vector V for each fan-out of the sink Si. When more than one state vector V is propagated to the same gate, an OR operation is performed on the state vectors V, i.e. an OR operation is performed on state vectors V for all fan-ins so as to merge these state vectors V. The result is then propagated along the output nets of the circuit element in the logic design. When a state vector having all 1s in the bits of the state vector is generated at a logic element, that logic element is a candidate root of a multiplexer tree structure. A candidate root of a multiplexer tree structure is marked as such in the logic design of the integrated circuit device so that it may be used by the logic re-synthesizing engine 370.

FIG. 8 is an example diagram of a circuit illustrating a correspondingly generated state table data structure T and state vectors V in accordance with one illustrative embodiment. In this example, input nets denoted dn are data nets and input nets 4, 5, 6, and 7 are control nets. The input nets N4, N5, N6, and N7 are the inverted form of the nets 4, 5, 6, and 7, respectively.

The state table data structure T 830 is generated using the algorithm described in FIG. 6 above for the sinks $S_i$ 810-816. Since sink $S_1$, i.e. NOR gate 810, is a NOR gate, and its inputs are 5 and N6, i.e. an input $K_1$ is not inverted and an input $K_2$ is inverted, then the row of the state table data structure T 830 corresponding to sink $S_1$, i.e. row 1, has state values of 0, 1. Since sink $S_2$, i.e. NOR gate 812, is a NOR gate, and its inputs are N5 and N6, i.e. both inverted, then the row of the state table data structure T 830 corresponding to sink $S_2$, i.e. row 2, has state values of 1, 1. Similarly, for sink $S_3$ 814, the row has state values 1, 0 and for the sink $S_4$ 816, the row for has state values 0, 0. Since the state table data structure T 830 comprises all $2^n$ logic states, i.e. all 4 logic states in this case, the net group K comprising input nets 4-6 and N4-N6 are control nets and the circuit is a potential n to $2^n$ decoder.

Having identified the control nets of this portion of the logic design of the integrated circuit device with regard to the NAND gate 820, the control line and multiplexer tree root marking engine 360 identifies the multiplexer tree root for this portion of the logic design by generating and propagating a state vector for each sink Si 810-816 in the manner described above with regard to FIG. 7. For each sink Si, a state vector is generated that comprises a 1 in the ith bit position and 0's in the remaining bit positions. Thus, for example, for sink S1, the state vector V for the sink S1 810 is 1000. Similarly, for sink S2 812, the state vector V is 0100, sink S3 814 has a state vector V of 0010, and sink S4 816 has a state vector V of 0001. These are show as being propagated down the nets from the sinks S1-S4 810-816 to the gates 840-846 and ultimately to NAND gate 820. At each gate along the nets, the state vectors V of the inputs to that gate are merged by an OR operation. Thus, for example, since the input nets to the AOI122 gate 840 are both 1000, the output state vector V of the gate AOI22 is also 1000. The same is true for the other gates 842-846 where the state vectors for the input nets of these gates are the same in each case and thus, the output state vector of these gates 842-846 mirrors the state vectors of the input nets due to the OR operation. If, however, the input nets have different state vectors, the OR operation would result in these different state vectors being merged into a new state vector that is propagated along the output net of the gate that is a combination of the states in the input net state vectors.

At the NAND gate 820, the four input net state vectors are merged using an OR operation. This results in a state vector V associated with the NAND gate 820 that is a combination of the states of the various state vectors of the input nets. In this case, the merged state vector of the NAND gate 820 is 1111. As set forth in FIG. 7 described above, if a state vector has a state of all 1's then the corresponding circuit element, e.g., gate, is a candidate multiplexer tree root and is marked as such.

The marked control lines and multiplexer tree root information may be provided to the logic resynthesizing engine 370 which may perform a re-synthesizing operation on the portions of the logic design corresponding to these marked control lines and multiplexer tree roots. This logic re-synthesizing may involve the application of a logic decomposition operation on the marked control lines and multiplexer tree root which converts these portions of the logic design to corresponding multiplexer tree structures. This may be done by identifying cones of logic to re-implement, where the cones of logic are defined by the marked control lines and the output, converting the cone of logic to a BDD (see R. Bryant, "Graph Based Algorithms for Boolean Function Manipulation," IEEE Transactions on Computers, 35 (8):677-691, August 1986 as background on BDD), and remapping based on this canonical form. See Kravets et al. "Resynthesis of Multi-Level Circuits Under Tight Constraints Using Symbolic Optimization," pp. 687-693, ICCAD, 2002, which is hereby incorporated by reference, as one example of how such conversion and remapping can be performed.

Figure 9:
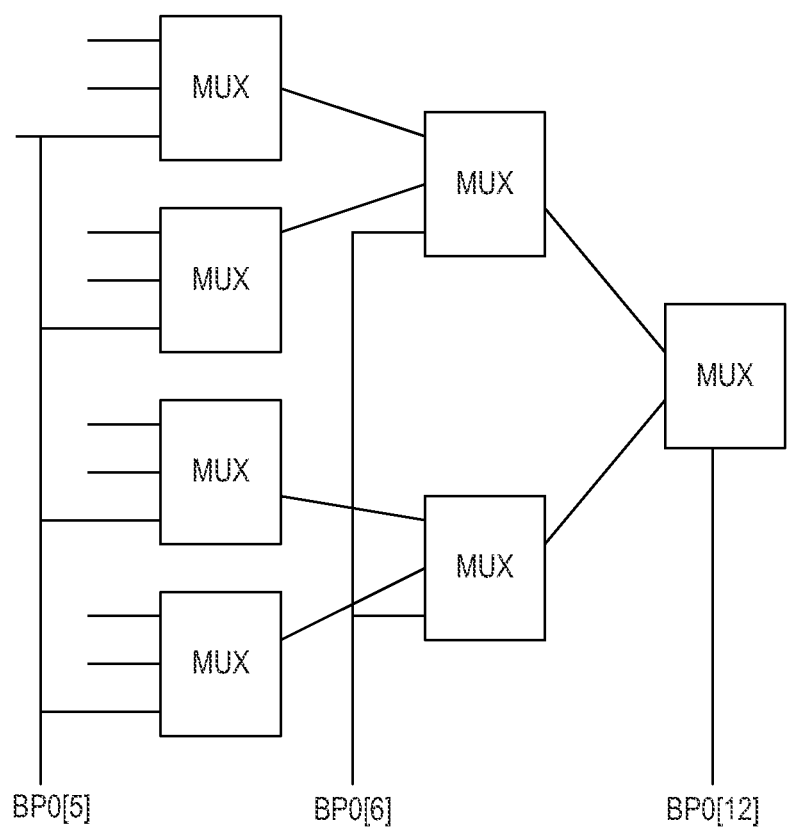
FIG. 9 illustrates a multiplexer tree structure generated as a result of the application of the logic re-synthesizing to the portions of the logic design identified through the marking of control lines and multiplexer tree roots in the logic design of FIG. 8.

FIG. 9 illustrates a multiplexer tree structure generated as a result of the application of the logic re-synthesizing to the portions of the logic design identified through the marking of control lines and multiplexer tree roots in the logic design of FIG. 8. It can be seen from FIG. 9 that the multiplexer tree structure in FIG. 9 result in a lower number of pins than the logic design shown in FIG. 8 and the multiplexer tree structure of FIG. 9 provides allows placement tools to place the logic with improved wirelength results when compared to the logic design of FIG. 8.

The resulting re-synthesized logic design may be provided to a physical synthesis tool for performing physical placement and wire routing. The process for performing physical synthesis is generally known in the art and thus, a detailed explanation is not provided herein. The physical layout of the integrated circuit device may then be used to perform fabrication of the physical integrated circuit device in a manner generally known in the art. It should be noted that, through implementation of the illustrative embodiments, the physical synthesis operation is simplified considerably. Moreover, wiring congestion, wirelength, and pin counts are dramatically reduced in the resulting physical synthesis based on the application of the mechanisms of the illustrative embodiments. It has been found, through empirical studies, that approximately 2× improvement in the number of areas of the physical layout having over 90% congestion, i.e. 90% of channels being occupied by wire routings. Furthermore, it has been found that approximately 10× improvement in the number of areas of the physical layout having 100% congestion. Moreover, a wirelength savings of approximately 4% and a pin count reduction of approximately 1.3% is achieved. Most importantly, detailed routing may be reduce from approximately four days running time with a significant likelihood of a crash in the process, to approximately 36 hours with a significantly lower likelihood of a crash in the process.

Figure 10:
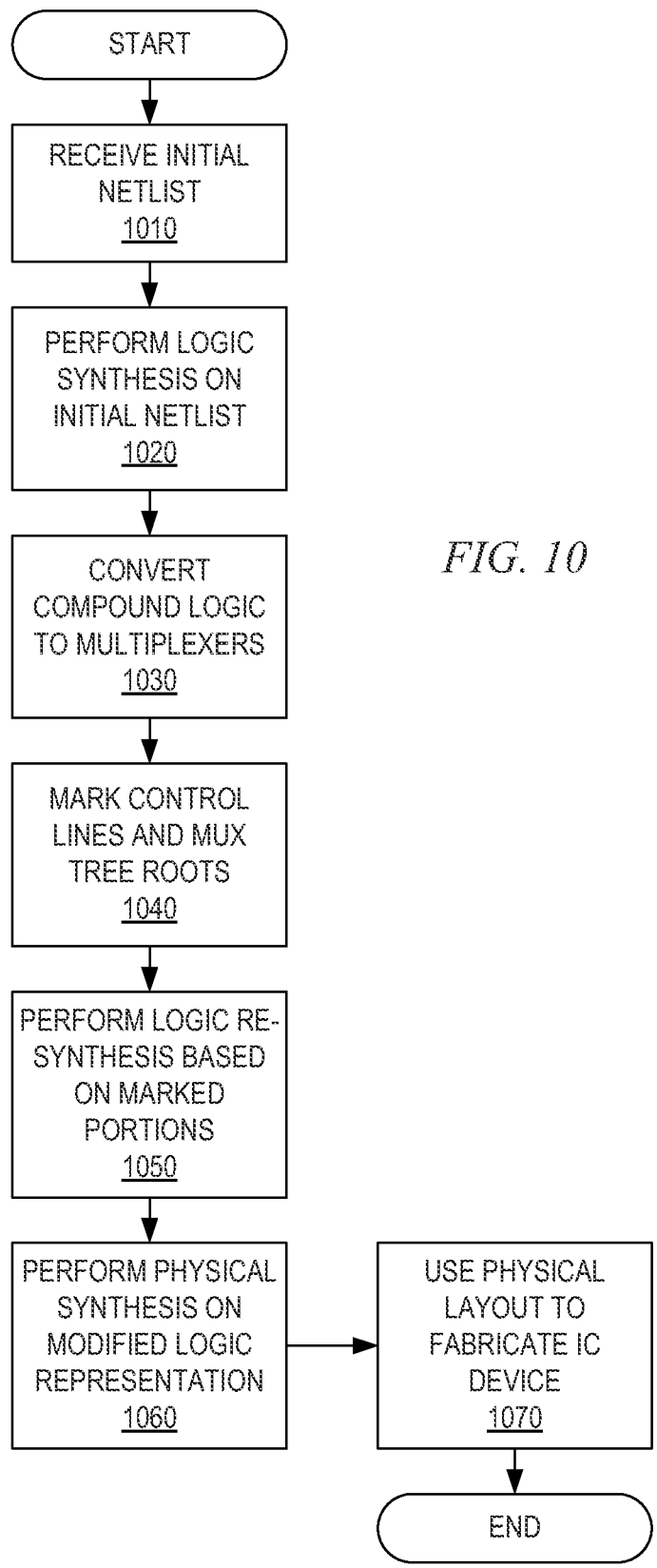
FIG. 10 is an example flowchart outlining an example operation for performing logic re-synthesis in accordance with one illustrative embodiment.

FIG. 10 is an example flowchart outlining an example operation for performing logic re-synthesis in accordance with one illustrative embodiment. The operation outlined in FIG. 10 may be implemented by the augmented logic synthesis mechanisms of the illustrative embodiments, for example.

As shown in FIG. 10, the operation starts with receiving an initial netlist of an integrated circuit design (step 1010). An initial logic synthesis operation is performed on the initial netlist to generate an initial logic design for the integrated circuit device (step 1020). Compound logic gates in the initial logic designs are converted to multiplexers (step 1030). Control lines and multiplexer tree roots are marked (step 1040) and a logic re-synthesis operation is performed on the portions of the logic design corresponding to the marked control lines and multiplexer tree roots (step 1050). The resulting re-synthesized logic design of the integrated circuit device is provided to a physical synthesis system to generate a physical layout of the integrated circuit device (step 1060). The physical layout is then used to fabricate the actual integrated circuit device (step 1070). The operation then terminates.

Figure 11:
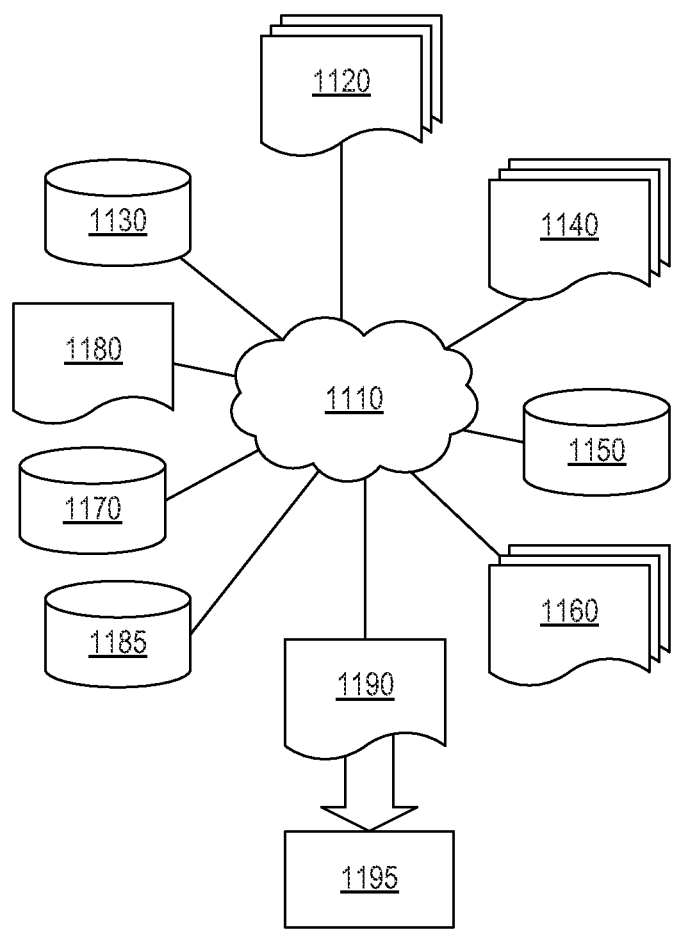
FIG. 11 is a flow diagram of a design process used in semiconductor design, manufacture, and/or test in which aspects of the illustrative embodiments may be implemented.

FIG. 11 shows a block diagram of an exemplary design flow 1100 used for example, in semiconductor design, manufacturing, and/or test. Design flow 1100 may vary depending on the type of IC being designed. For example, a design flow 900 for building an application specific IC (ASIC) may differ from a design flow 1100 for designing a standard component. Design structure 1120 is preferably an input to a design process 1110 and may come from an IP provider, a core developer, or other design company or may be generated by the operator of the design flow, or from other sources. Design structure 1120 comprises an a specification of an integrated circuit device in the form of schematics or HDL, a hardware-description language (e.g., Verilog, VHDL, C, etc.). Design structure 1120 may be contained on one or more machine readable medium. For example, design structure 1120 may be a text file or a graphical representation of an integrated circuit device. Design process 1110 preferably synthesizes (or translates) the integrated circuit device design structure 1120 into a netlist 1180, where netlist 1180 is, for example, a list of wires, transistors, logic gates, control circuits, I/O, models, etc. that describes the connections to other elements and circuits in an integrated circuit design and recorded on at least one of machine readable medium. This may be an iterative process in which netlist 1180 is resynthesized one or more times depending on design specifications and parameters for the circuit and using the mechanisms of the illustrative embodiments detailed above.

Design process 1110 may include using a variety of inputs; for example, inputs from library elements 1130 which may house a set of commonly used elements, circuits, and devices, including models, layouts, and symbolic representations, for a given manufacturing technology (e.g., different technology nodes, 32 nm, 45 nm, 90 nm, etc.), design specifications 1140, characterization data 1150, verification data 1160, design rules 1170, and test data files 1185 (which may include test patterns and other testing information). Design process 1110 may further include, for example, standard circuit design processes such as timing analysis, verification, design rule checking, place and route operations, etc. One of ordinary skill in the art of integrated circuit design can appreciate the extent of possible electronic design automation tools and applications used in design process 1110 without deviating from the scope and spirit of the invention. The design structure of the invention is not limited to any specific design flow.

Design process 1110 preferably translates an integrated circuit device design, along with any additional integrated circuit design or data (if applicable), into a second design structure 1190. Design structure 1190 resides on a storage medium in a data format used for the exchange of layout data of integrated circuits (e.g. information stored in a GDSII (GDS2), GL1, OASIS, or any other suitable format for storing such design structures). Design structure 1190 may comprise information such as, for example, test data files, design content files, manufacturing data, layout parameters, wires, levels of metal, vias, shapes, data for routing through the manufacturing line, and any other data required by a semiconductor manufacturer to produce an integrated circuit device. Design structure 1190 may then proceed to a stage 1195 where, for example, design structure 1190: proceeds to tape-out, is released to manufacturing, is released to a mask house, is sent to another design house, is sent back to the customer, etc.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system comprising at least one hardware-implemented processor and at least one memory, for generating a logic design of an integrated circuit device, comprising:

receiving, in the data processing system, an initial logic design representation of the integrated circuit device;

identifying, by the data processing system, one or more areas of the initial logic design representation where logic elements in the one or more areas can be replaced with one or more multiplexer tree structures;

replacing, by the data processing system, logic elements in the one or more areas of the initial logic design representation with multiplexer tree structures to generate a modified logic design representation;

outputting, by the data processing system, the modified logic design representation to a physical synthesis system to generate a physical layout of the integrated circuit device based on the modified logic design representation;

identifying and marking control lines in one of the initial logic design representation or the modified logic design representation;

identifying and marking multiplexer tree roots in one of the initial logic design representation or the modified logic design representation; and performing re-synthesis of portions of the modified logic design representation corresponding to the marked control lines and multiplexer roots, wherein identifying and marking control lines comprises:

selecting a logic gate in one of the initial logic design representation or the modified logic design representation;

analyzing the nets of the selected logic gate to generate a state table for the selected logic gate;

determining, based on the state table for the selected logic gate, whether the selected logic gate is a potential decoder; and marking nets corresponding to the selected logic gate as control lines in response to a determination that the selected logic gate is a potential decoder.

2. The method of claim 1, wherein identifying one or more areas of the initial logic design representation comprises identifying compound logic elements in the initial logic design representation of the integrated circuit device.

3. The method of claim 2, wherein replacing logic elements in the one or more areas of the initial logic design representation comprises converting the compound logic elements of the initial logic design representation to multiplexer structures to thereby generate the one or more multiplexer tree structures.

4. The method of claim 3, wherein the multiplexer structures are 2-to-1 multiplexer structures.

5. The method of claim 3, wherein the compound logic elements comprise at least one of an AND-OR (AO) logic gate, an OR-AND (OA) logic gate, an AND-OR-INVERT (AOI) logic gate, and OR-AND-INVERT (OAI) logic gate.

6. The method of claim 1, wherein the modified logic design representation has a smaller number of pins and smaller wire length than the initial logic design representation.

7. The method of claim 1, further comprising fabricating the integrated circuit device based on the generated physical layout.

8. A method, in a data processing system comprising at least one hardware-implemented processor and at least one memory, for generating a logic design of an integrated circuit device, comprising:

receiving, in the data processing system, an initial logic design representation of the integrated circuit device;

identifying, by the data processing system, one or more areas of the initial logic design representation where logic elements in the one or more areas can be replaced with one or more multiplexer tree structures;

replacing, by the data processing system, logic elements in the one or more areas of the initial logic design representation with multiplexer tree structures to generate a modified logic design representation;

outputting, by the data processing system, the modified logic design representation to a physical synthesis system to generate a physical layout of the integrated circuit device based on the modified logic design representation identifying and marking control lines in one of the initial logic design representation or the modified logic design representation;

identifying and marking multiplexer tree roots in one of the initial logic design representation or the modified logic design representation; and performing re-synthesis of portions of the modified logic design representation corresponding to the marked control lines and multiplexer roots, wherein identifying and marking the multiplexer tree roots comprises:

for each sink gate Si associated with logic gates of interest in one of the initial logic design representation or the modified logic design representation, generating a state vector having a first value in an ith state bit position in the state vector and a second value in each other state bit position in the state vector, where i is a row of a state table corresponding to the logic gate of interest;

propagating state vectors of the sink gates Si forward along nets of one of the initial logic design representation or the modified logic design representation corresponding to the logic gates of interest, where state vectors are merged at each circuit element along the nets to generate resultant state vectors which are then propagated forward along remaining nets; and marking a circuit element as a root of a multiplexer tree in response to a resultant state vector associated with circuit element having the first value in all state bit positions of the resultant state vector.

9. A computer program product comprising a non-transitory computer readable medium having a computer readable program stored therein, wherein the computer readable program, when executed on a computing device, causes the computing device to:

receive an initial logic design representation of the integrated circuit device;

identify one or more areas of the initial logic design representation where logic elements in the one or more areas can be replaced with one or more multiplexer tree structures;

replace logic elements in the one or more areas of the initial logic design representation with multiplexer tree structures to generate a modified logic design representation;

output the modified logic design representation to a physical synthesis system to generate a physical layout of the integrated circuit device based on the modified logic design representation;

identify and mark control lines in one of the initial logic design representation or the modified logic design representation;

identify and mark multiplexer tree roots in one of the initial logic design representation or the modified logic design representation; and perform re-synthesis of portions of the modified logic design representation corresponding to the marked control lines and multiplexer roots, wherein the computer readable program causes the computing device to identify and mark control lines at least by:

selecting a logic gate in one of the initial logic design representation or the modified logic design representation;

analyzing the nets of the selected logic gate to generate a state table for the selected logic gate;

determining, based on the state table for the selected logic gate, whether the selected logic gate is a potential decoder; and marking nets corresponding to the selected logic gate as control lines in response to a determination that the selected logic gate is a potential decoder.

10. The computer program product of claim 9, wherein the computer readable program causes the computing device to identify one or more areas of the initial logic design representation by identifying compound logic elements in the initial logic design representation of the integrated circuit device.

11. The computer program product of claim 10, wherein the computer readable program causes the computing device to replace logic elements in the one or more areas of the initial logic design representation by converting the compound logic elements of the initial logic design representation to multiplexer structures to thereby generate the one or more multiplexer tree structures.

12. The computer program product of claim 11, wherein the multiplexer structures are 2-to-1 multiplexer structures.

13. The computer program product of claim 11, wherein the compound logic elements comprise at least one of an AND-OR (AO) logic gate, an OR-AND (OA) logic gate, an AND-OR-INVERT (AOI) logic gate, and OR-AND-INVERT (OAI) logic gate.

14. The computer program product of claim 9, wherein the modified logic design representation has a smaller number of pins and smaller wire length than the initial logic design representation.

15. A computer program product comprising a non-transitory computer readable storage medium having a computer readable program stored therein, wherein the computer readable program, when executed on a computing device, causes the computing device to:
receive an initial logic design representation of the integrated circuit device;
identify one or more areas of the initial logic design representation where logic elements in the one or more areas can be replaced with one or more multiplexer tree structures;
replace logic elements in the one or more areas of the initial logic design representation with multiplexer tree structures to generate a modified logic design representation;
output the modified logic design representation to a physical synthesis system to generate a physical layout of the integrated circuit device based on the modified logic design representation;
identify and mark control lines in one of the initial logic design representation or the modified logic design representation;
identify and mark multiplexer tree roots in one of the initial logic design representation or the modified logic design representation; and
perform re-synthesis of portions of the modified logic design representation corresponding to the marked control lines and multiplexer roots, wherein the computer readable program causes the computing device to identify and mark the multiplexer tree roots at least by:
for each sink gate Si associated with logic gates of interest in one of the initial logic design representation or the modified logic design representation, generating a state vector having a first value in an ith state bit position in the state vector and a second value in each other state bit position in the state vector, where i is a row of a state table corresponding to the logic gate of interest;
propagating state vectors of the sink gates Si forward along nets of one of the initial logic design representation or the modified logic design representation corresponding to the logic gates of interest, where state vectors are merged at each circuit element along the nets to generate resultant state vectors which are then propagated forward along remaining nets; and
marking a circuit element as a root of a multiplexer tree in response to a resultant state vector associated with circuit element having the first value in all state bit positions of the resultant state vector.

16. An apparatus, comprising:
a processor; and
a memory coupled to the processor, wherein the memory comprises instructions which, when executed by the processor, cause the processor to:
receive an initial logic design representation of the integrated circuit device;
identify one or more areas of the initial logic design representation where logic elements in the one or more areas can be replaced with one or more multiplexer tree structures;
replace logic elements in the one or more areas of the initial logic design representation with multiplexer tree structures to generate a modified logic design representation;
output the modified logic design representation to a physical synthesis system to generate a physical layout of the integrated circuit device based on the modified logic design representation;
identify and mark control lines in one of the initial logic design representation or the modified logic design representation;
identify and mark multiplexer tree roots in one of the initial logic design representation or the modified logic design representation; and
perform re-synthesis of portions of the modified logic design representation corresponding to the marked control lines and multiplexer roots, wherein the instructions cause the processor to identify and mark control lines at least by:
selecting a logic gate in one of the initial logic design representation or the modified logic design representation;
analyzing the nets of the selected logic gate to generate a state table for the selected logic gate;
determining, based on the state table for the selected logic gate, whether the selected logic gate is a potential decoder; and
marking nets corresponding to the selected logic gate as control lines in response to a determination that the selected logic gate is a potential decoder.

* * * * *